United States Patent
Ono

(10) Patent No.: US 8,203,473 B2
(45) Date of Patent: Jun. 19, 2012

(54) SWITCHED-CAPACITOR INPUT CIRCUIT AND ANALOG-TO-DIGITAL CONVERTER INCLUDING THE SAME

(75) Inventor: Toshiaki Ono, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 45 days.

(21) Appl. No.: 12/947,683

(22) Filed: Nov. 16, 2010

(65) Prior Publication Data

US 2011/0133966 A1  Jun. 9, 2011

(30) Foreign Application Priority Data

Dec. 9, 2009  (JP) ................................. 2009-279815

(51) Int. Cl.
*H03M 1/06* (2006.01)
(52) U.S. Cl. ........................................ 341/118; 341/155
(58) Field of Classification Search .................. 341/118, 341/172, 122, 155; 330/9
See application file for complete search history.

(56) References Cited

U.S. PATENT DOCUMENTS

| | | | |
|---|---|---|---|
| 5,008,607 A | 4/1991 | Ono et al. | |
| 5,239,576 A | 8/1993 | Yoshida et al. | |
| 5,699,366 A | 12/1997 | Ono | |
| 6,433,712 B1 | 8/2002 | Ohnhaeuser et al. | |
| 7,577,766 B2 | 8/2009 | Ono | |
| 2005/0040982 A1* | 2/2005 | Daito | 341/162 |

FOREIGN PATENT DOCUMENTS

JP  2003-60505 A  2/2003

OTHER PUBLICATIONS

U.S. Appl. No. 12/943,772, filed Nov. 10, 2010. Applicant: Toshiaki Ono.

* cited by examiner

*Primary Examiner* — Peguy Jean Pierre
(74) *Attorney, Agent, or Firm* — Fitzpatrick, Cella, Harper & Scinto

(57) ABSTRACT

A switched-capacitor input circuit which receives an analog input signal, and samples and holds the analog input signal, comprising an amplifier, at least one capacitor, one terminal of the capacitor being connected to an input terminal of the amplifier, and a first switch configured to selectively connect the other terminal of the capacitor to one of a first reference voltage, a second reference voltage, and a third reference voltage, wherein the first switch connects the other terminal of the capacitor to the first reference voltage so as to perform offset correction of ternary weight 0, the first switch connects the other terminal of the capacitor to the second reference voltage so as to perform offset correction of ternary weight 1, the first switch connects the other terminal of the capacitor to the third reference voltage so as to perform offset correction of ternary weight 2.

4 Claims, 6 Drawing Sheets

| STATUS | SW1 | SW2 | SW3 |
|---|---|---|---|
| SAMPLING | ON | OFF | ON |
| HOLDING | OFF | ON | OFF |

| OFFSET CORRECTION | $SW_{C1}$ |
|---|---|
| 0 | VrefH |
| 1 | VrefM |
| 2 | VrefL |

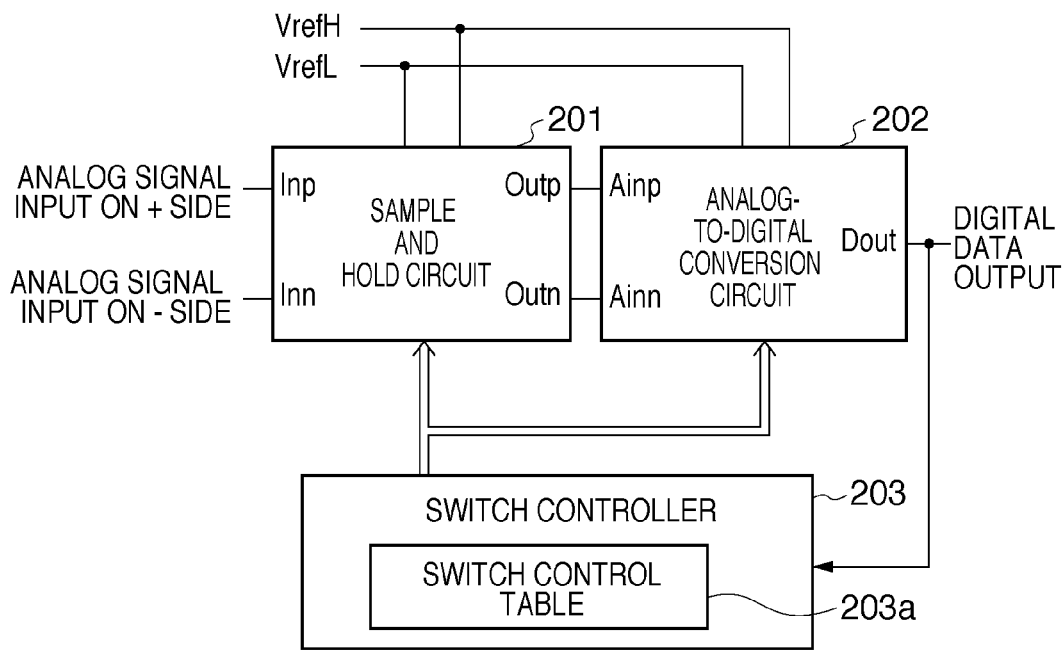

FIG. 6B

| STATUS | SW1 | SW2 | SW3 | SW4 | SW5 |
|---|---|---|---|---|---|
| SAMPLING | ON | ON | OFF | ON | ON |
| HOLDING | OFF | OFF | ON | OFF | OFF |

| OFFSET CORRECTION | SWc1 | SWc2 | SWc3 | SWc4 | SWc5 | SWc6 |
|---|---|---|---|---|---|---|
| 000 | VrefH | VrefH | VrefH | VrefL | VrefL | VrefL |
| 001 | VrefM | VrefH | VrefH | VrefM | VrefL | VrefL |
| 002 | VrefL | VrefH | VrefH | VrefH | VrefL | VrefL |
| 010 | VrefH | VrefM | VrefH | VrefL | VrefM | VrefL |
| ⋮ | ⋮ | ⋮ | ⋮ | ⋮ | ⋮ | ⋮ |
| 020 | VrefH | VrefL | VrefH | VrefL | VrefM | VrefL |
| ⋮ | ⋮ | ⋮ | ⋮ | ⋮ | ⋮ | ⋮ |
| 100 | VrefH | VrefH | VrefM | VrefL | VrefL | VrefM |
| ⋮ | ⋮ | ⋮ | ⋮ | ⋮ | ⋮ | ⋮ |
| 222 | VrefL | VrefL | VrefL | VrefH | VrefH | VrefH |

203a

SWITCHED-CAPACITOR INPUT CIRCUIT AND ANALOG-TO-DIGITAL CONVERTER INCLUDING THE SAME

BACKGROUND OF THE INVENTION

1. Field of the Invention

The present invention relates to a switched-capacitor input circuit and an analog-to-digital converter (ADC) including the same. More specifically, the present invention relates to a method and circuit for correcting an offset component of an input signal of an ADC and, more particularly, to offset correction of an input signal of a switched-capacitor ADC.

2. Description of the Related Art

As a circuit for removing an offset component of an input signal and extracting useful signal information in an ADC, a circuit having a capacitor for offset correction using a switched-capacitor circuit is known (Japanese Patent Laid-Open No. 2003-060505). This circuit performs offset correction at a desired accuracy using a necessary number of binary weighted capacitors.

The technique described in Japanese Patent Laid-Open No. 2003-060505 allows offset correction in $2^n$ steps using n offset correction capacitors. To increase the number of steps of offset correction amount to improve the offset correction accuracy, the number of capacitors needs to be increased. This leads to an increase in the capacitor layout area.

SUMMARY OF THE INVENTION

The present invention provides an input circuit capable of performing offset correction in $3^n$ steps using n offset correction capacitors and an analog-to-digital converter including the same.

The first aspect of the present invention provides a switched-capacitor input circuit which receives an analog input signal, and samples and holds the analog input signal, comprising an amplifier, at least one capacitor, one terminal of the capacitor being connected to an input terminal of the amplifier, and a first switch configured to selectively connect the other terminal of the capacitor to one of a first reference voltage, a second reference voltage, and a third reference voltage, wherein the third reference voltage and the second reference voltage are higher than the first reference voltage, and the second reference voltage is an intermediate voltage between the first reference voltage and the third reference voltage, the first switch connects the other terminal of the capacitor to the first reference voltage so as to perform offset correction of ternary weight 0, the first switch connects the other terminal of the capacitor to the second reference voltage so as to perform offset correction of ternary weight 1, the first switch connects the other terminal of the capacitor to the third reference voltage so as to perform offset correction of ternary weight 2, and the offset correction is done by ternary weighting.

The second aspect of the present invention provides an analog-to-digital converter comprising an input circuit as defined above, and an analog-to-digital conversion circuit configured to perform analog-to-digital conversion of an output signal from the input circuit.

According to the present invention, the voltage of one terminal of an offset correction capacitor can be switched in three steps. This enables offset correction to be performed in $3^n$ steps using n offset correction capacitors. It is therefore possible to increase the number of steps of offset correction amount to improve the offset correction accuracy while suppressing the capacitor layout area.

Further features of the present invention will become apparent from the following description of exemplary embodiments with reference to the attached drawings.

BRIEF DESCRIPTION OF THE DRAWINGS

FIG. 6A is a block diagram showing an example of the arrangement of a differential analog-to-digital converter according to the second embodiment;

FIG. 6B is a view showing an example of a switch control table; and

DESCRIPTION OF THE EMBODIMENTS

First Embodiment

An arrangement and operation according to the first embodiment of the present invention will be described with reference to FIGS. 1A to 4.

<Example of Arrangement of Analog-to-Digital Converter (ADC) of First Embodiment>

Figures 1A, 1B:
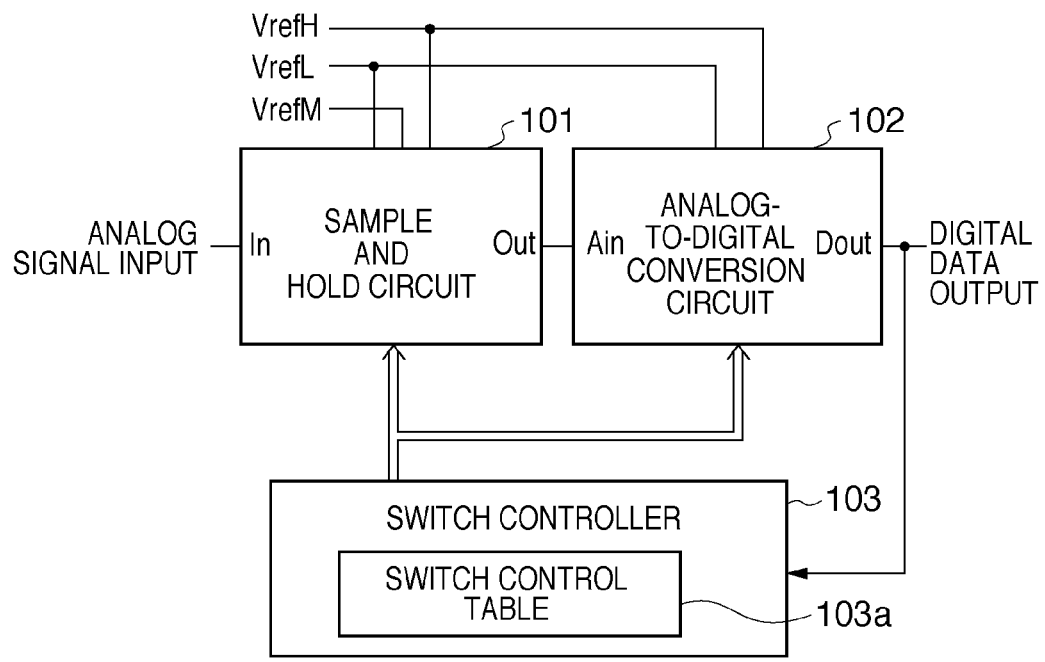
FIG. 1A is a block diagram showing an example of the arrangement of an analog-to-digital converter according to the first embodiment.
FIG. 1B is a view showing an example of a switch control table of the analog-to-digital converter according to the first embodiment.

In an ADC shown in FIG. 1A, a sample and hold circuit 101 serving as a switched-capacitor input circuit receives an analog input signal input to an input terminal In, samples and holds the signal, and outputs it to an output terminal Out. An analog-to-digital conversion circuit 102 receives the output signal, converts the signal into digital data, and outputs it to an output terminal Dout. VrefL and VrefH are lower and higher reference voltages, respectively. The analog-to-digital conversion circuit 102 compares the two reference voltages with the analog input signal, and converts the analog input signal into digital data. In the first embodiment, not only the two reference voltages but also a reference voltage VrefM is supplied to the sample and hold circuit 101 as well and used for input offset correction. The reference voltage VrefM= (VrefL+VrefH)/2.

(Example of Arrangement of Switch Control Table 103a)

A switch control table 103a in FIG. 1B stores control signals to control the switches in correspondence with the offset correction values and the statuses of the sample and hold circuit 101. In this example, the control signals in detailed examples of the sample and hold circuit 101 shown in FIGS. 2A, 2B, 3A, and 3B are represented by the states of switches.

<Examples of Circuit and Operation of Sample and Hold Circuit 101>

(Example of Sampling)

Figure 2A:
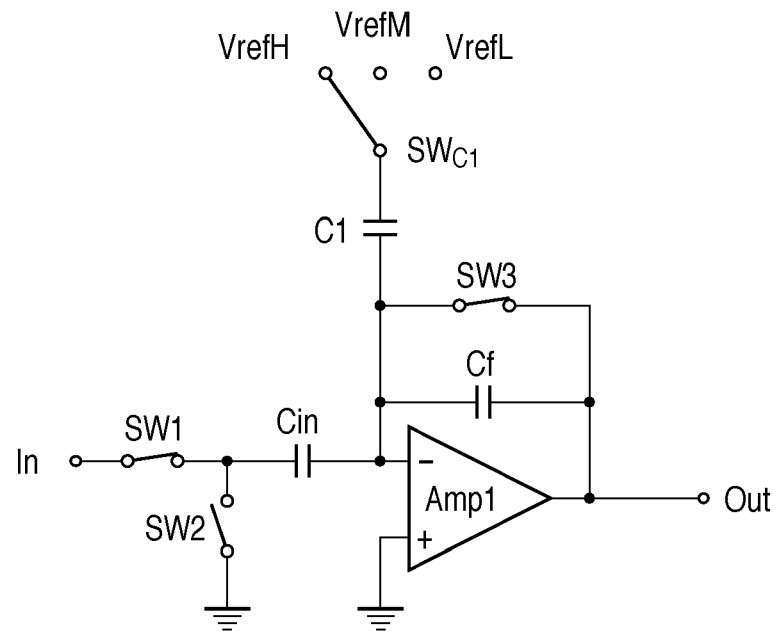
FIG. 2A is a connection diagram showing the state of a sample and hold circuit according to the first embodiment upon sampling.

FIG. 2A is a circuit diagram of the sample and hold circuit 101, which illustrates the connection state upon sampling. Amp1 is a differential amplifier, Cin is an input capacitor, Cf is a feedback capacitor, and C1 is an offset correction capacitor. One terminal of the capacitor C1 is connected to the amplifier, and the other terminal of the capacitor C1 is selectively connected to the first reference voltage VrefH, the second reference voltage VrefM serving as an intermediate voltage, or the third reference voltage VrefL via a first switch $SW_{c1}$. The capacitance ratio of the capacitors is Cin:Cf:C1=100:50:1. Upon sampling, the two terminals of the capacitor Cf are short-circuited by a switch SW3 so as to reset the output Out. The capacitor Cin is connected to the input In via a switch SW1 to store the input signal in the capacitor Cin. In addition, the capacitor C1 is connected to the reference voltage VrefH to accumulate charges.

(Example of Holding without Offset Correction)

Figure 2B:
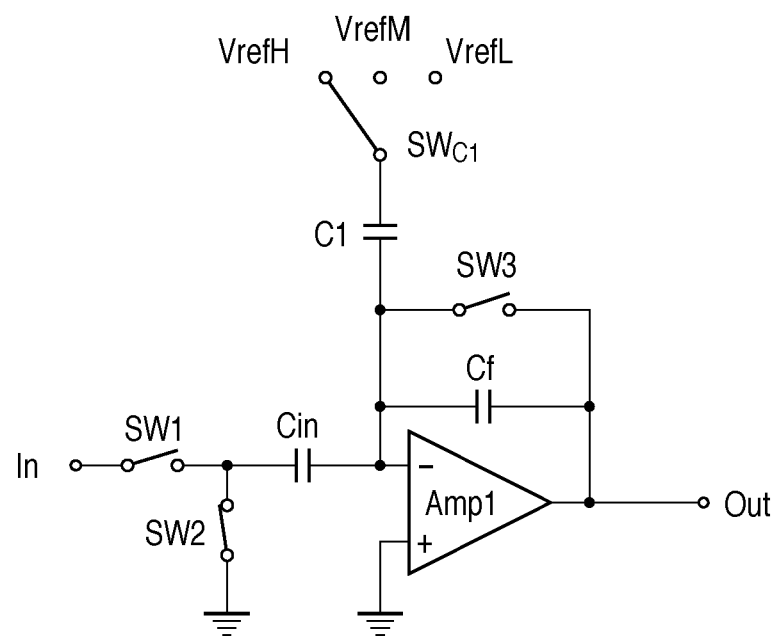
FIG. 2B is a connection diagram showing the state of the sample and hold circuit according to the first embodiment upon holding without offset correction.

FIG. 2B is a circuit diagram showing the connection state of the sample and hold circuit 101 upon holding without offset component correction. First, the switch SW3 opens to cancel reset. After that, the capacitor Cin is connected to the ground voltage via a switch SW2. Charges accumulated in the capacitor Cin then move to the capacitor Cf, and appear as an output voltage. Since Cin:Cf=2:1, Out=2×In based on charge conservation and the relation Q=CV. Since the connection relationship of the capacitor C1 is the same as in sampling, no charge movement occurs, and the output voltage is not affected.

(Example of Holding with Correction of First Offset Amount)

Figure 3A:
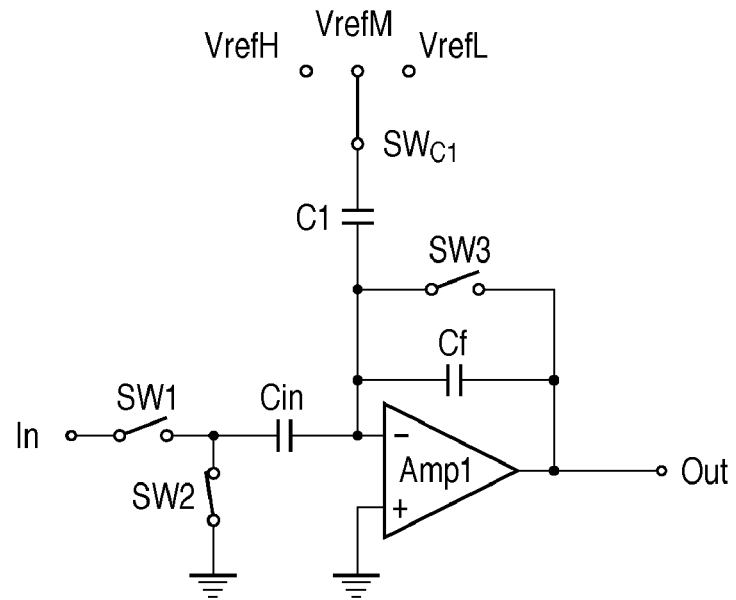
FIGS. 3A and 3B are connection diagrams showing the states of the sample and hold circuit according to the first embodiment upon holding with offset correction.

FIG. 3A is a circuit diagram showing the connection state of the sample and hold circuit 101 upon holding with correction of a first offset amount. Even in this case, the sampling state is the same as in FIG. 2A. The connection state of the capacitor C1 is different from that in the holding state without offset correction shown in FIG. 2B. The capacitor C1 is connected to the reference voltage VrefH upon sampling but to the reference voltage VrefM upon holding. Charges accumulated in the capacitor C1 then move to the capacitor Cf, and affect the output voltage. Since C1:Cf=1:50, the amount is given by 0.02×(VrefH−VrefM). This equals 0.01×(VrefH−VrefL) because VrefM=(VrefL+VrefH)/2. This is the offset correction amount. As a result, considering charge movement from the capacitor Cin to the capacitor Cf, the output voltage is given by Out=2×In +0.01×(VrefH−VrefL).

(Example of Holding with Correction of Second Offset Amount)

Figure 3B:
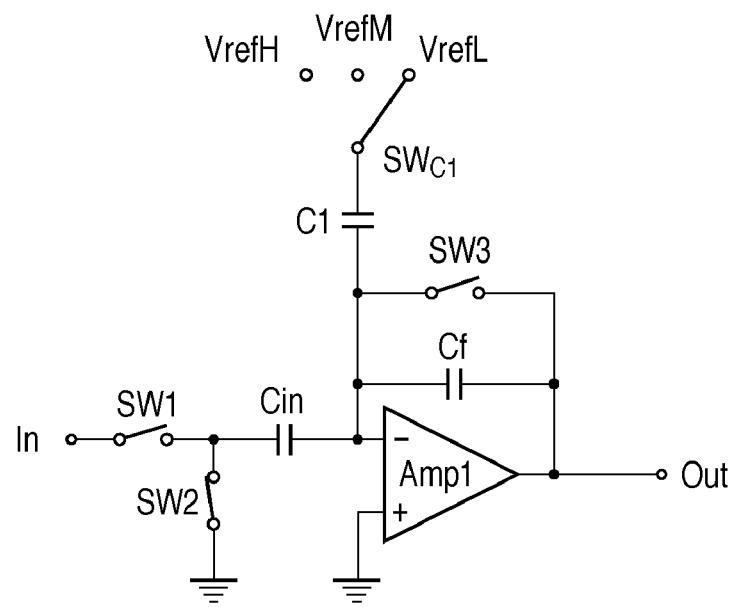

FIG. 3B is a circuit diagram showing the connection state of the sample and hold circuit 101 upon holding with correction of a second offset amount. Even in this case, the sampling state is the same as in FIG. 2A. The connection state of the capacitor C1 is different from that in the holding state without offset correction shown in FIG. 2B. The capacitor C1 is connected to the reference voltage VrefH upon sampling but to the reference voltage VrefL upon holding. Charges accumulated in the capacitor C1 then move to the capacitor Cf, and affect the output voltage. Since C1:Cf=1:50, the amount is given by 0.02×(VrefH−VrefL). This is the offset correction amount. As a result, considering charge movement from the capacitor Cin to the capacitor Cf, the output voltage is given by Out=2×In+0.02×(VrefH−VrefL). That is, offset correction in an amount twice as large as that in the holding state in FIG. 3A is possible.

<Example of Control Procedure of Switch Controller 103 of Embodiment>

Figure 4:
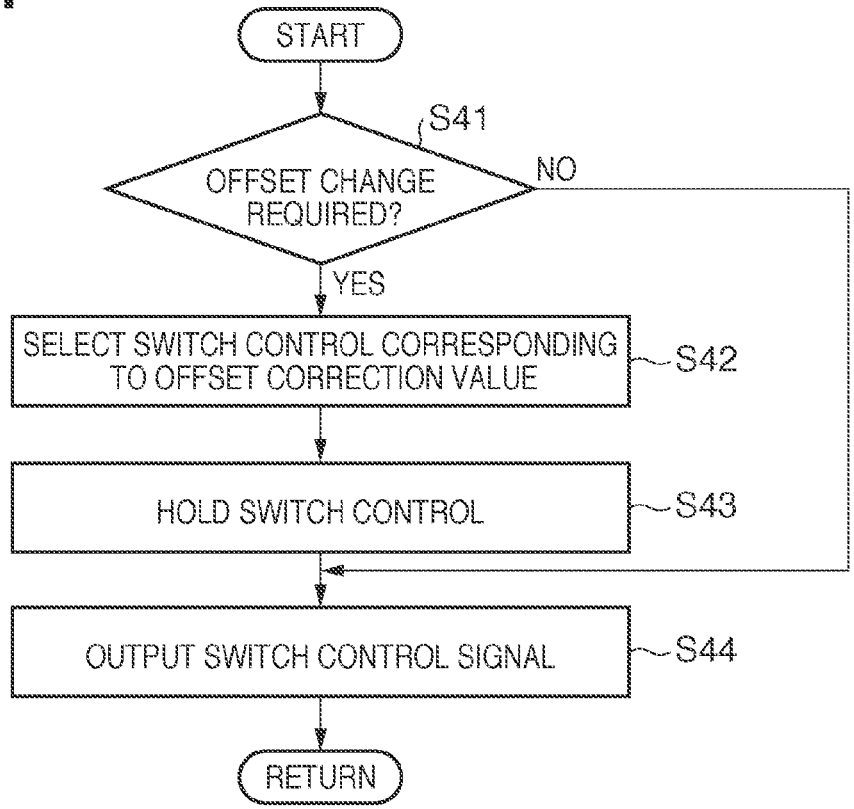
FIG. 4 is a flowchart illustrating an example of the processing procedure of a switch controller according to the embodiment.

According to the example of the control procedure of the switch controller 103 shown in FIG. 4, the switch controller 103 determines in step S41 based on digital data output from the analog-to-digital conversion circuit 102 whether offset change is necessary. If necessary, in step S42, the switch controller 103 selects a combination of switch settings corresponding to the offset correction value from the table shown in FIG. 1B. In step S43, the switch controller 103 holds the selected switch setting combination for offset correction from then on. In step S44, the switch controller 103 outputs, to the sample and hold circuit 101, switch control signals based on the new switch setting combination set in step S43 or a previous switch setting combination (if NO in step S41). This control procedure may be either executed as software under the CPU of the switch controller 103 or incorporated in the switch controller 103 as hardware.

<Effect of First Embodiment>

As described above, the offset correction amount can be controlled in three steps to 0, 0.01×(VrefH−VrefL), and 0.02×(VrefH−VrefM) using only one offset correction capacitor C1.

<Modification of First Embodiment>

Figure 5:
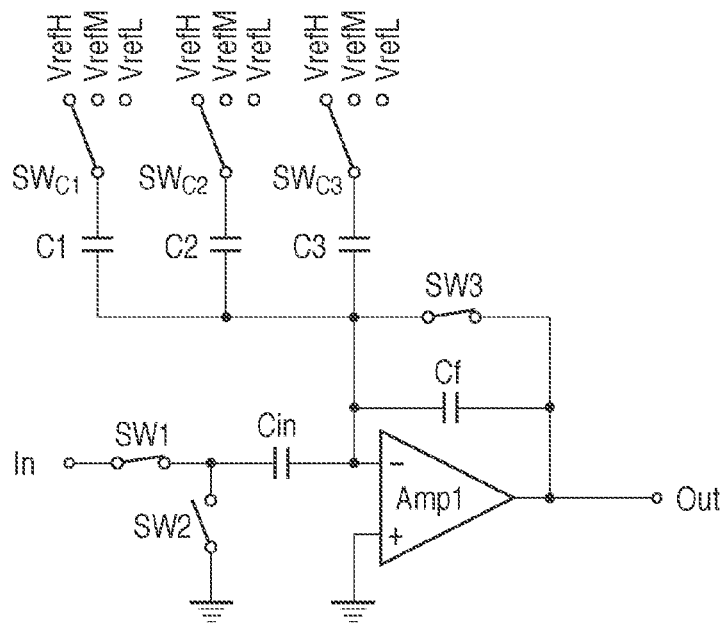
FIG. 5 is a circuit diagram showing another example of the sample and hold circuit according to the first embodiment, which includes a plurality of capacitors connected.

To further increase the number of steps of offset correction, the offset correction capacitor is formed from a plurality of capacitive elements C1 to C3 respectively connected to a plurality of first switches $SW_{c1}$ to $SW_{c3}$, as shown in FIG. 5, and the capacitance ratio is set by ternary weighting. For example, when Cin:Cf:C1:C2:C3=100:50:1:3:9, the offset correction amount can be controlled in 27 steps to 0, 0.01×(VrefH−VrefL), . . . and 0.26×(VrefH−VrefL).

Note that in this embodiment, the capacitor C1 is connected to the reference voltage VrefH upon sampling and to the reference voltage VrefM upon holding, thereby implementing offset correction of 0.01×(VrefH−VrefL). However, another connection method can also implement offset correction in the same amount. For example, even when the circuit operates so as to connect the capacitor C1 to the reference voltage VrefM upon sampling and to the reference voltage VrefL upon holding, offset correction of 0.01×(VrefH−VrefL) can be implemented.

Second Embodiment

An arrangement and operation according to the second embodiment of the present invention will be described with reference to FIGS. 6A, 6B, and 7.

<Example of Arrangement of ADC of Second Embodiment>

In a differential ADC according to the second embodiment shown in FIG. 6A, a differential sample and hold circuit 201 samples differential analog signals input to input terminals Inp and Inn, holds the signals, and outputs them to output terminals Outp and Outn. A differential analog-to-digital conversion circuit 202 receives the outputs, converts them into digital data, and outputs it to an output terminal Dout. VrefL and VrefH are lower and higher reference voltages, respectively. The differential analog-to-digital conversion circuit 202 compares the two voltages with the input voltages, and converts the signals into digital data. In this embodiment, the two voltages are supplied to the differential sample and hold circuit 201 as well and used for input offset correction. A switch controller 203 outputs control signals to control switching in the sample and hold circuit 201 and the analog-to-digital conversion circuit 202. The switch controller 203 has a switch control table 203a that stores combinations of control signals to switches corresponding to the statuses of each circuit and offset correction values.

(Example of Arrangement of Switch Control Table 203a)

The switch control table 203a in FIG. 6B stores control signals to control the switches in correspondence with the statuses of the sample and hold circuit 201 and offset correction values. In this example, the control signals in a detailed example of the sample and hold circuit 201 shown in FIG. 7 are represented by the states of switches.

<Examples of Circuit and Operation of Sample and Hold Circuit 201>

Figure 7:
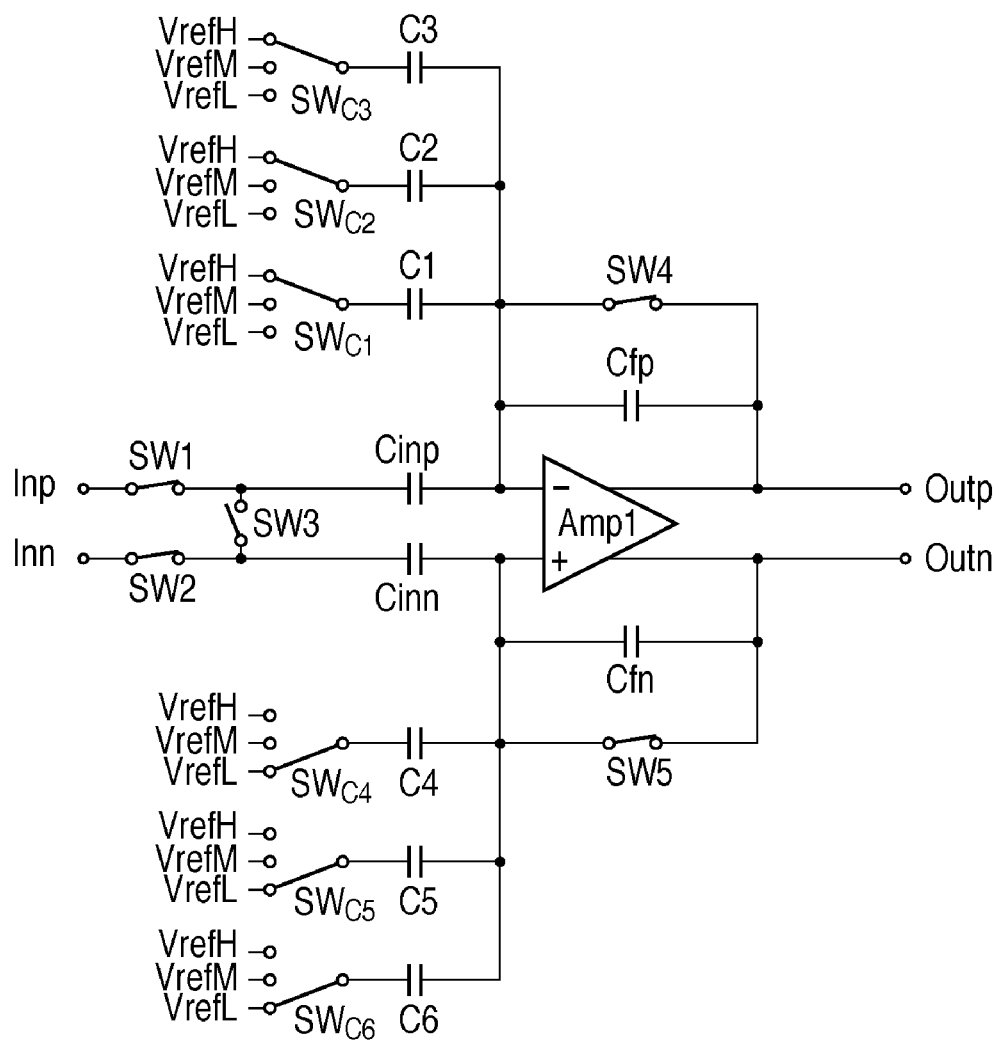
FIG. 7 is a circuit diagram showing a detailed example of a sample and hold circuit according to the second embodiment.

In the circuit example of the sample and hold circuit 201 of the second embodiment shown in FIG. 7, first capacitors C1 to C3 for offset correction connected to the inverting input terminal of a differential amplifier Amp1 and second capacitors C4 to C6 for offset correction connected to the non-inverting input terminal are illustrated. The capacitors C1 to C3 are a plurality of capacitive elements of the first capacitor. The other terminals of the capacitive elements C1 to C3 are connected to first switches $SW_{c1}$ to $SW_{c3}$. The capacitors C4 to C6 are a plurality of capacitive elements of the second capacitor. The other terminals of the capacitive elements C4 to C6 are connected to second switches $SW_{c4}$ to $SW_{c6}$. Assume that Cinp:Cinn:Cfp:Cfn:C1:C2:C3:C4:C5:C6=100:100:50:50:1:3:9:1:3:9. Switches that switch connection to the reference voltages VrefH, VrefL, and VrefM are connected to the other terminal of each of the first and second capacitors C1 to C6. FIG. 7 shows switch connection upon sampling. In this case, ternary weighting of three bits is possible in which the capacitors C1 and C4 represent the lower bit, the capacitors C2 and C5 represent the intermediate bit, and the capacitors C3 and C6 represent the higher bit.

<Effect of Second Embodiment>

As described above, the above-described arrangement enables ternary weighting of offset correction using the switch combinations shown in FIG. 6B without increasing the number of capacitors.

Note that in this embodiment, the capacitor C1 is connected to the reference voltage VrefH upon sampling and to the reference voltage VrefM upon holding, thereby implementing offset correction of 0.01×(VrefH−VrefL). However, another connection method can also implement offset correction in the same amount. For example, even when the circuit operates so as to connect the capacitor C1 to the reference voltage VrefM upon sampling and to the reference voltage VrefL upon holding, offset correction of 0.01×(VrefH−VrefL) can be implemented.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-279815, filed Dec. 9, 2009, which is hereby incorporated by reference herein in its entirety.

What is claimed is:

1. A switched-capacitor input circuit which receives an analog input signal, and samples and holds the analog input signal, comprising:
   an amplifier;
   at least one capacitor, one terminal of the capacitor being connected to an input terminal of the amplifier; and
   a first switch configured to selectively connect the other terminal of the capacitor to one of a first reference voltage, a second reference voltage, and a third reference voltage;
   wherein the third reference voltage and the second reference voltage are higher than the first reference voltage, and the second reference voltage is an intermediate voltage between the first reference voltage and the third reference voltage,
   the first switch connects the other terminal of the capacitor to the first reference voltage so as to perform offset correction of ternary weight 0, the first switch connects the other terminal of the capacitor to the second reference voltage so as to perform offset correction of ternary weight 1, the first switch connects the other terminal of the capacitor to the third reference voltage so as to perform offset correction of ternary weight 2, and
   the offset correction is done by ternary weighting.

2. The circuit according to claim 1, wherein
   the capacitor comprises a plurality of capacitive elements having a capacitance ratio of 1:3:9, each of the plurality of capacitive elements having one terminal connected to the input terminal of the amplifier and the other terminal connected to a corresponding one of a plurality of first switches so as to connect the first reference voltage, and
   the offset correction is done by ternary weighting of three bits in which a capacitor corresponding to term 1 of the capacitance ratio is defined as a lower bit, a capacitor corresponding to term 3 of the capacitance ratio is defined as an intermediate bit, and a capacitor corresponding to term 9 of the capacitance ratio is defined as an higher bit.

3. The circuit according to claim 1, wherein
   the amplifier comprises a differential amplifier,
   the at least one capacitor comprises:
   a first capacitor having one terminal connected to a non-inverting input terminal of the differential amplifier and the other terminal connected to the first switch to connect one of the first reference voltage, the second reference voltage, and the third reference voltage; and
   a second capacitor having one terminal connected to an inverting input terminal of the differential amplifier and the other terminal connected to a second switch to connect one of the first reference voltage, the second reference voltage, and the third reference voltage,
   the first switch connects the other terminal of the first capacitor to the first reference voltage, and the second switch connects the other terminal of the second capacitor to the second reference voltage so as to perform offset correction of ternary weight 0, the other terminal of the first capacitor is connected to the second reference voltage, and the second switch connects the other terminal of the second capacitor to the second reference voltage so as to perform offset correction of ternary weight 1, and the first switch connects the other terminal of the first capacitor to the second reference voltage, and the second switch connects the other terminal of the second capacitor to the first reference voltage so as to perform offset correction of ternary weight 2, and
   the offset correction is done by ternary weighting.

4. An analog-to-digital converter comprising:
   an input circuit of claim 1; and
   an analog-to-digital conversion circuit configured to perform analog-to-digital conversion of an output signal from the input circuit.

* * * * *